(12) United States Patent  
Bas et al.

(10) Patent No.: US 7,839,210 B2  
(45) Date of Patent: Nov. 23, 2010

(54) DETECTOR OF A RADIO-FREQUENCY SIGNAL

(75) Inventors: Gilles Bas, Beauvoisin (FR); Marc Battista, Marseilles (FR)

(73) Assignee: STMicroeletronics (Rousset) SAS, Rousset (FR)

( * ) Notice: Subject to any disclaimer, the term of this patent is extended or adjusted under 35 U.S.C. 154(b) by 36 days.

(21) Appl. No.: 12/248,581

(22) Filed: Oct. 9, 2008

(65) Prior Publication Data

US 2009/0096520 A1 Apr. 16, 2009

(30) Foreign Application Priority Data

Oct. 11, 2007 (FR) .................................. 07/58230

(51) Int. Cl.
*H03D 1/00* (2006.01)
*H03D 1/18* (2006.01)
(52) U.S. Cl. ........................ 329/369; 329/347
(58) Field of Classification Search ................ 329/347, 329/349, 369; 327/50, 51
See application file for complete search history.

(56) References Cited

U.S. PATENT DOCUMENTS

| 6,239,625 | B1 | 5/2001 | Abe |
| 6,608,995 | B1 | 8/2003 | Kawasaki et al. |
| 6,710,716 | B1 | 3/2004 | Abe et al. |
| 2004/0018821 | A1 | 1/2004 | Bar-David et al. |
| 2006/0273171 | A1* | 12/2006 | Shyu .......................... 235/435 |
| 2008/0169873 | A1* | 7/2008 | Toda .......................... 329/369 |

OTHER PUBLICATIONS

French Search Report dated May 9, 2008 from French Patent Application No. 07/58230.

* cited by examiner

*Primary Examiner*—David Mis
(74) *Attorney, Agent, or Firm*—Lisa K. Jorgenson; James H. Morris; Wolf, Greenfield & Sacks, P.C.

(57) ABSTRACT

A method and a circuit for detecting a radio-frequency signal, including at least one first MOS transistor with a channel of a first type, having its gate coupled to an input terminal capable of receiving said signal; a circuit for biasing the first transistor, capable of biasing it to a level lower than its threshold voltage; and a circuit for determining the average value of the current in the first transistor.

22 Claims, 6 Drawing Sheets

DETECTOR OF A RADIO-FREQUENCY SIGNAL

CROSS REFERENCE TO RELATED APPLICATIONS

This application claims the priority benefit of French patent application number 07/58230, filed on Oct. 11, 2007, entitled "Detector of a Radio-Frequency Signal," which is hereby incorporated by reference to the maximum extent allowable by law.

BACKGROUND OF THE INVENTION

1. Field of the Invention

The present invention generally relates to the field of electronic circuits and, more specifically, to electronic circuits comprising a detector of radio-frequency signals, for example, for demodulation purposes.

2. Discussion of the Related Art

Several techniques for demodulating an amplitude-modulated radio-frequency signal are known.

A first technique uses a diode with an anode which receives the signal to be demodulated and with a cathode which is connected to the input of a low-pass filter providing the envelope signal. This type of envelope detector requires that the signal to be demodulated reaches the diode with an amplitude greater than the diode threshold (several hundreds of millivolts).

To detect signals modulated with a lower amplitude, an amplifier is interposed upstream and/or downstream of the diode. A disadvantage then is the increased power consumption of the amplifier. This power consumption increases along with the carrier frequency, and thus with the possible transmission rate.

Another so-called coherent demodulation technique uses a differential amplifier receiving the signal to be demodulated. The amplifier is followed by a multiplier (differential outputs of the amplifier) having its output driving a low-pass filter. A disadvantage here again is the circuit power consumption.

Another so-called super-regenerative technique uses an oscillator controlled by the output of a differential amplifier receiving the signal to be demodulated and having its output rectified by a diode, upstream of a low-pass filter. Here again, a problem is posed with the high required power consumption.

An increase in the transmission rate generates an increase in the consumed power. Such an increase is not desirable for consumption reasons Such is, for example, the case for electromagnetic transponders equipped with an on board power source (battery).

In other cases, the power supply may not transmit the desired rates. Such is, for example, the case for electromagnetic transponders remotely supplied by a high-frequency field radiated by a read or read/write terminal. The power available on the transponder side decreases as the transponder is further from the reader or from the terminal which generates the high-frequency field.

In other cases still, it may be desired to detect that a transponder (having its own supply source) is present in the electromagnetic field of a read/write terminal. This amounts to detecting, on the transponder side, the presence of the field. The sooner a field is desired to be detected when a transponder comes closer to a reader, the lower the level to be detected.

EP-A-0 982 847 discloses a high frequency power detection circuit comprising a field effect transistor to the gate of which the high frequency signal is input, and a load capacitor and a load resistor connected in parallel between the source of the field effect transistor and the ground.

SUMMARY OF THE INVENTION

Thus, an embodiment described herein provides a circuit for detecting a radio-frequency signal which overcomes all or part of the disadvantages of known demodulators.

An embodiment aims at an architecture adaptable to different supply voltages.

An embodiment aims at a circuit which is not sensitive to temperature or manufacturing technology variations.

An embodiment aims at decreasing the consumed power while detecting low amplitudes.

An embodiment aims at detecting the presence of an electromagnetic field.

An embodiment aims at an amplitude demodulator.

To achieve all or part of these objects as well as others, an embodiment of the present invention provides a detector of a radio-frequency signal, comprising:

at least one first MOS transistor with a channel of a first type, having its gate coupled to an input terminal capable of receiving said signal;

a circuit for biasing the first transistor, capable of biasing it to a level lower than its threshold voltage; and a circuit for determining the average value of the current in the first transistor.

According to an embodiment, the bias circuit comprises:

a first impedance formed of one or several second MOS transistors with a channel of a second type, in series, and assembled as diodes;

a first current source in series with said first impedance, formed of one or several third MOS transistors with a channel of the first type in series, the number of third transistors being identical to the number of first transistors;

a second current source; and an auto-bias circuit formed of one or several fourth MOS transistors with a channel of the first type, in series and assembled as diodes, the first and third transistors forming current mirrors with the fourth transistor(s).

According to an embodiment, the gate(s) of the third and fourth transistors are coupled, by one or several resistive elements, to the respective gate(s) of the first transistors.

According to an embodiment, the first transistor(s) are in series with a second impedance between two terminals of application of a D.C. supply voltage, the midpoint of the series association being connected to the input of the element for determining the average value.

According to an embodiment, said second impedance is formed of one or several fifth MOS transistors with a channel of the second type in series, the number of fifth transistors being identical to the number of second transistors with which they respectively form current mirrors.

According to an embodiment, at least one gain limiter is coupled in parallel with said second impedance.

According to an embodiment, the respective gate(s) of the first transistors are coupled to an input terminal intended to receive said radio-frequency signal via one or several capacitive decoupling elements.

According to an embodiment, the element for determining the average value comprises a low-pass filter.

According to an embodiment, the first channel type is N and the second channel type is P, the first transistor(s) being on the side of the terminal of application of the lowest potential of the supply voltage.

According to an embodiment, the first channel type is P and the second channel type is N, the first transistor(s) being on the side of the terminal of application of the highest potential of the supply voltage.

The present invention also provides an amplitude demodulator, comprising:

a detector of a radio-frequency signal, said average value of which provides the modulation envelope; and a comparator of information linked to said average value with respect to a threshold.

The present invention also provides an amplitude demodulation method, comprising:

applying a signal to be demodulated onto the gate of at least one first MOS transistor, biased to a level lower than its threshold voltage;

averaging information relative to the current in the first transistor; and deducing therefrom the signal envelope.

The present invention also provides a system for detecting a radio-frequency signal comprising:

an antenna;

a detector of a radio-frequency signal; and a unit for processing the signal provided by the detector.

According to an embodiment, the system is comprised within an electromagnetic transponder.

The foregoing objects, features, and advantages of embodiments of the present invention will be discussed in detail in the following non-limiting description of specific embodiments in connection with the accompanying drawings.

DETAILED DESCRIPTION

The same elements have been designated with the same reference numerals in the different drawings.

For clarity, only those elements which are useful to the understanding of the present invention have been shown and will be described. In particular, the destination of the detected or demodulated signals has not been detailed, the present invention being compatible with any current use of such signals. Further, the transmission and possible coding mechanisms have not been detailed either, the present invention being here again compatible with any amplitude modulation transmission mechanism.

Figure 1:
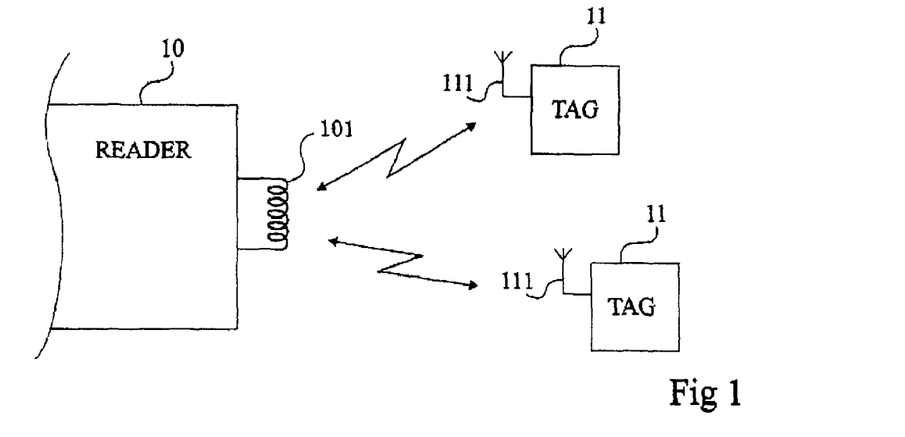
FIG. 1 is a block diagram of an electromagnetic transponder system to which the present invention applies as an example.

FIG. 1 very schematically shows an example of a communication system of the type to which the present invention applies as an example.

A read/write terminal 10 (READER) is capable of communicating in a contactless manner with one or several transponders 11 (TAG), for example, electronic tags. The reader comprises an oscillating circuit (for example, a series oscillating circuit) having its inductive element forming an antenna 101 for generating a high-frequency electromagnetic field. Transponder(s) 11 comprise oscillating circuits (for example, parallel resonant circuits) having their inductive elements forming antennas 111. The oscillating circuits of the reader and of the transponders of a same system are most often approximately tuned to the same frequency. Transponders 11 may be remotely supplied by the reader, that is, draw the power necessary to the operation of the circuits that they comprise from the field radiated by the reader. They may also operate on a battery.

A transmission in the reader-to-terminal direction is, for example, performed by amplitude modulation of the remote-supply carrier, possibly after coding of the data to be transmitted.

To transmit data from the transponder to the terminal, the transponder modifies (for example, by switching a resistor and/or a capacitor of its resonant circuit) the load that it forms on the electromagnetic field of the reader. This variation is generally performed at the rate of a sub-carrier (called the retromodulation sub-carrier) having a frequency smaller than that of the remote-supply carrier.

In practice, a reader periodically transmits requests. As soon as a transponder enters the field and captures the request, it answers thereto, for example by sending an identifier. In the simplest applications, the processing stops here. In other cases, a communication is then completed between the transponder and the reader, during which various data may be exchanged.

Figure 2:
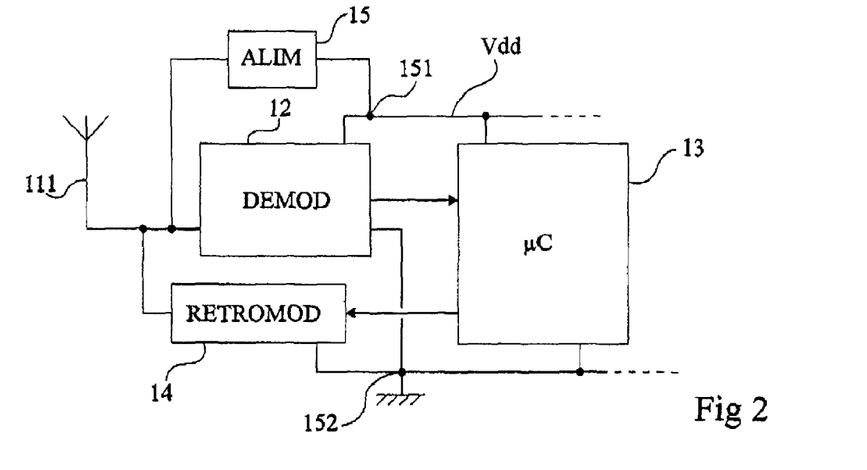
FIG. 2 is a block diagram of a transponder of the system of FIG. 1.

FIG. 2 is a simplified block diagram of an example of a transponder of the system of FIG. 1.

Antenna 111 is connected to the input of a demodulator 12 (DEMOD) having its output exploited by digital circuits, for example, a microcontroller 13 (μC). The digital circuits are also used to control a retromodulation circuit or stage 14 (RETROMOD) to transmit data (for example, the identifier of the electronic tag formed by the transponder). In the case of a remotely supplied transponder, a supply circuit 15 (ALIM) generates a D.C. supply voltage Vdd based on the signal across the resonant circuit (antenna 111 plus one or several capacitive elements, not shown). Otherwise, a battery or another power source provides voltage Vdd. Voltage Vdd is applied between two terminals 151 and 152 to which are connected the respective supply terminals of the different circuits to be supplied. Circuit 15, for example, comprises one or several rectification elements associated with a storage element, possibly completed with a regulator. Other digital circuits, not shown, (for example, storage elements or other processing elements) may be supplied with voltage Vdd.

In this type of application, the power available on the transponder side depends on the distance between said transponder and the reader. Further, the power required for the communication increases along with the transmit frequency (and thus in practice with the transmit rate). A low supply voltage thus results either in imposing short distances between the transmitter and the receiver, or in limiting the communication rate.

More generally, the present invention relates to the demodulation of communications in amplitude modulation with a carrier frequency greater than some hundred kilohertz. For example, the present invention applies to communication of radio-frequency identification type (RFID), of ultra wide band type (UWB), etc.

More generally still, the present invention relates to the detection of a radio-frequency signal, for example, a transmission carrier or an electromagnetic field.

In such applications, it would be desirable to decrease the power consumption due to the often low available power.

Figure 3:
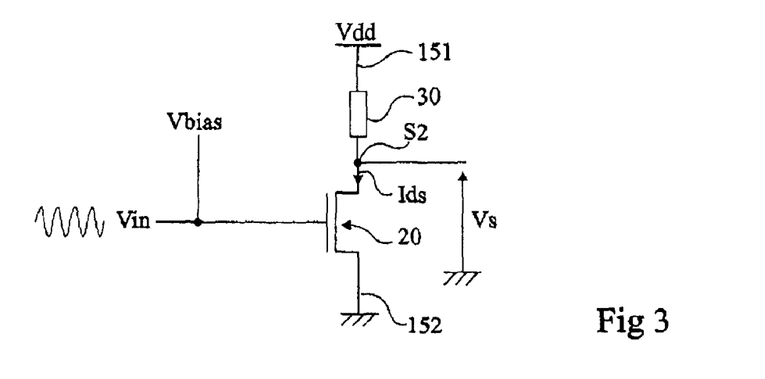
FIG. 3 is a simplified electric diagram of a detector according to an embodiment.

FIG. 3 schematically shows an embodiment of a detector.

The basic element is a MOS transistor 20 having the function of generating large distortions of a signal Vin to be demodulated, applied on its gate. For this purpose, transistor 20 is biased to a D.C. voltage Vbias of a value smaller than its threshold voltage (Vt). Transistor 20 is further in series with an impedance 30 (for example, a resistive element) between terminals 151 and 152 intended to see a D.C. supply voltage. In the example, terminal 151 is intended to be applied a positive voltage Vdd and terminal 152 is intended to be grounded. An output voltage Vs is sampled across the transistor and forms, as will be seen hereafter, a signal exploitable by downstream circuits. Signal Vin is, for example, a sinusoidal signal received by the antenna but more generally is any symmetrical signal, for example, a carrier modulated or not in amplitude.

Figure 4:
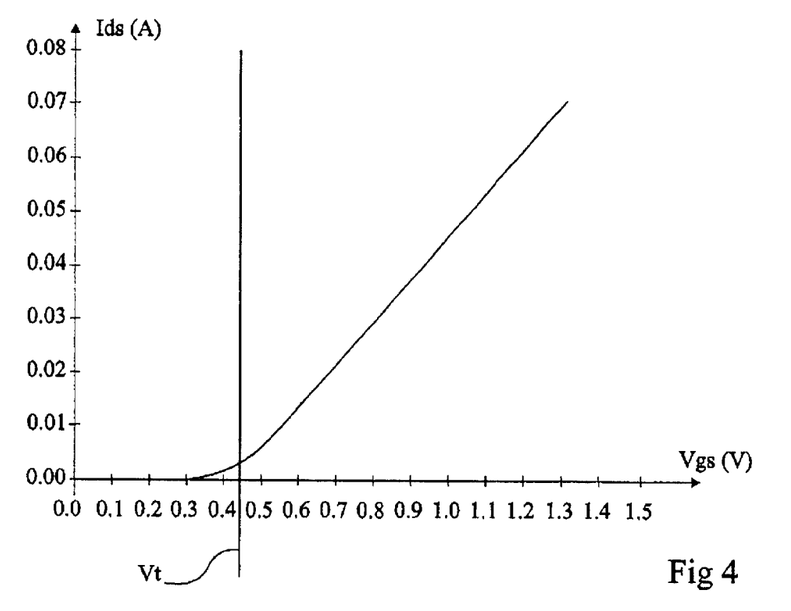
FIGS. 4 and 5 are current-vs.-voltage characteristics illustrating the operation of the detector of FIG. 3.
Figure 5:
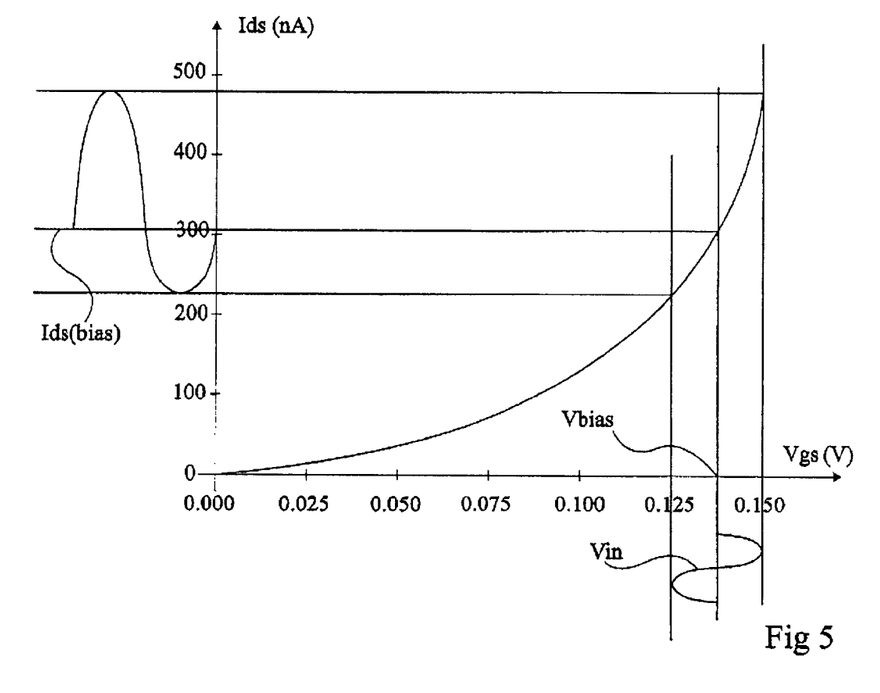

FIGS. 4 and 5 are current-vs.-voltage characteristics showing the variation of current Ids between the drain and the source of a MOS transistor according to voltage Vgs between its gate and its source. The example relates to an N-channel MOS transistor (FIG. 3) but can be transposed to a P-channel MOS transistor by inverting the signs.

FIG. 4 illustrates that characteristic Ids/Vgs is approximately linear in a range of voltages Vgs greater than a voltage Vt, called the transistor threshold voltage. This range corresponds to the current use of a transistor is in so-called saturated state where a small variation of the signal on the gate causes a large variation of current Ids.

FIG. 5 is an enlargement of the curve of FIG. 4 for voltages Vgs smaller than threshold voltage Vt. Current Ids is then no longer linear, but follows an exponential curve.

The present inventors have chosen to take advantage of this phenomenon so that the application on the transistor gate of a signal symmetrical with respect to a bias level Vbias translates as a signal which is asymmetrical with respect to a current Ids(bias) corresponding to the bias voltage. This characteristic is illustrated in FIG. 5, on the side of the diagram (current-vs.-voltage) by two symmetrical halfwaves illustrating the dynamic component of a signal Vin applied on the transistor gate and the corresponding current generated in the transistor. Surprisingly, the transistor thus biased appears to operate as a generator of distortions in the presence of a dynamic signal applied on its gate.

In the example of FIG. 5, for the positive halfwave of voltage Vin (as compared with the bias level), the amplitude of current Ids is greater than for the negative halfwave, even though the two halfwaves are of same amplitude. As a result, in the presence of an amplitude modulation (of its dynamic component) or of a carrier, the average value of current Ids is not equal to current Ids(bias) set by biasing Vbias, while the average value of voltage Vgs is equal to voltage Vbias.

It is thus possible to detect the carrier or the amplitude modulation by measuring information proportional to current Ids, preferably, by connecting transistor 20 in series with a resistive impedance (30, FIG. 3) and by measuring voltage Vs across transistor 20. In the example of FIG. 5, a sinusoidal variation of voltage Vgs by an amplitude on the order of 10 mV generates a distortion on the order of 0.1 µA on the current. The digital values given in FIGS. 4 and 5 are illustrations only and depend on the transistor features.

The use of the transistor within this range enables exploiting a modulation measurement under very low currents, and thus with a low consumption.

Further, if the amplitude of the received signal is such that the threshold voltage is exceeded, the operation is not altered. This simply increases the distortion, since positive halfwaves make the transistor then operate in its linear range (in saturation mode).

Figures 6, 7A:
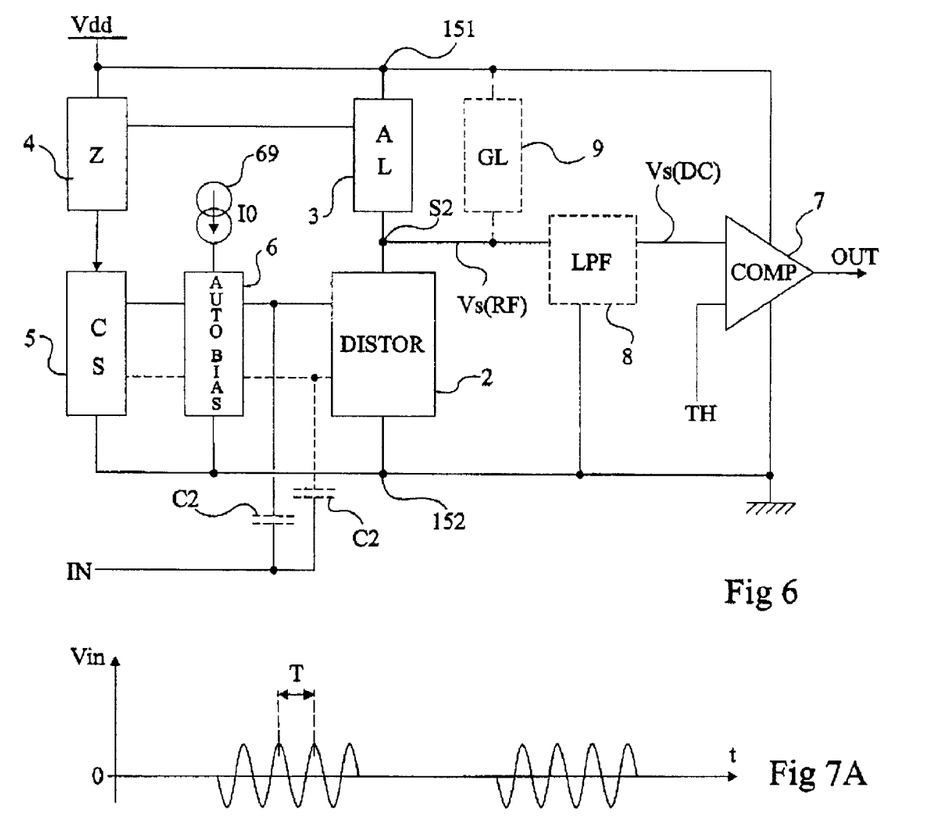
FIG. 6 is a block diagram of an embodiment of a demodulation circuit.
FIGS. 7A, 7B, and 7C are timing diagrams illustrating examples of shapes of signals of the circuit of FIG. 6.

FIG. 6 is a block diagram of functions contained in an embodiment of a demodulator.

Distortion stage 2 (DISTOR) comprising one or several MOS transistors in series is coupled in series with an active load 3 (AL), or dynamic impedance, between terminals 151 and 152 of application of D.C. supply voltage Vdd. Active load 3 biases terminal S2 between load 3 and generator 2 to a quiescent level V0. It thus implements a current-to-voltage conversion function. As compared with a resistor, it brings in a high dynamic resistance while allowing for a relatively high level V0. An impedance 4 (Z) is in series with a current source 5 (CS) between terminals 151 and 152. Active load 3 and impedance 4 (Z) implement a current mirror function which enables biasing the active load from current source 5. An auto-biasing circuit 6 (AUTO BIAS) is supplied with a current I0 provided by a current source 69. Circuits 5 and 6 form a current mirror which enables copying current I0 in the current source. Circuits 4, 5, and 6 (and preferably circuit 3) are in practice formed of MOS transistors. The transistor(s) of generator 2 also form a current mirror with that or those of circuit 6. Thus, circuit 6 provides the gate voltages of the transistors of generator 2 and of current source 5. Impedance 4 (1/gm), as well as active load 3, is then auto-biased according to current I0.

In the case of a block 2 with several transistors, signal Vin to be demodulated (input IN) is applied (to the transistor gates) by capacitive decoupling elements C2 (shown in dotted lines) due to the different bias levels of the different transistors. If block 2 comprises but a single transistor, the decoupling capacitance may be omitted.

The current in block 2, converted into voltage Vs(RF) due to load 3, is if need be filtered by a low-pass filter 8 (LPF) to provide a voltage Vs(DC) corresponding to the modulation envelope signal. The cut-off frequency of the filter is of course lower than the frequency of the modulation carrier.

A comparator (COMP) 7 can provide the state of demodulated signal OUT by comparing level Vs(DC) with a threshold TH, selected to that the comparator output switches in the presence of a modulation to be interpreted as a state switching. Threshold TH may be variable to adapt to an amplitude variation of signal Vs(DC), for example, according to the distance between the transponder and the reader. According to another example, threshold TH is selected to be greater than the two modulation levels while being lower than the quiescent level (bias level). A detector of the presence of the carrier, for example, a detector of the presence of an electromagnetic field, is thus obtained.

Other circuits for interpreting envelope signal Vs(DC) may be envisaged. For example, an analog and/or digital processing unit.

The optional character of filter 8 depends on the components of comparator 7 and of impedance 3 with respect to the desired cut-off frequency. A capacitive input of the comparator (MOS transistor gate) associated with impedance 3 may be enough for the low-pass filtering. Voltages Vs(DC) and Vs(RF) are, in the absence of filters, the same.

It should be noted that the maximum switching frequency of the circuit corresponds to that of the envelope signal (in the comparator or in another downstream circuit) and that no upstream element switches with a greater frequency. The power consumption of downstream circuits is thus decreased.

The circuit may also be equipped with one or several gain limiters 9 (GL) if the amplitude of the generated distortion is too high. Such a gain-limiting element may simply correspond to the addition of a resistor in parallel with active load 4 to decrease the value of the equivalent dynamic resistor in series with generator 2. Gain-limiting elements are for example used if the amplitude of signal Vin is likely to vary significantly (for example, according to the distance which separates a transponder from a transmitting terminal).

Figure 7B:
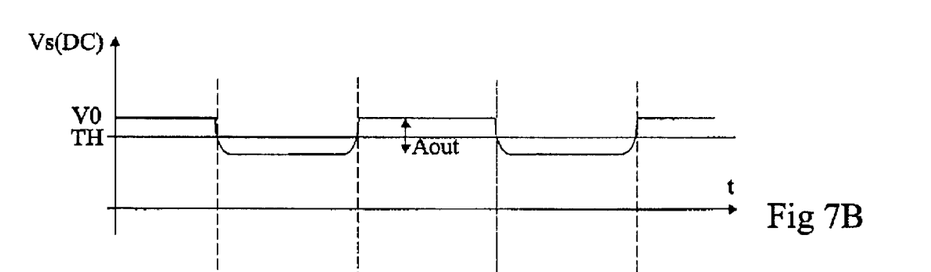
Figure 7C:
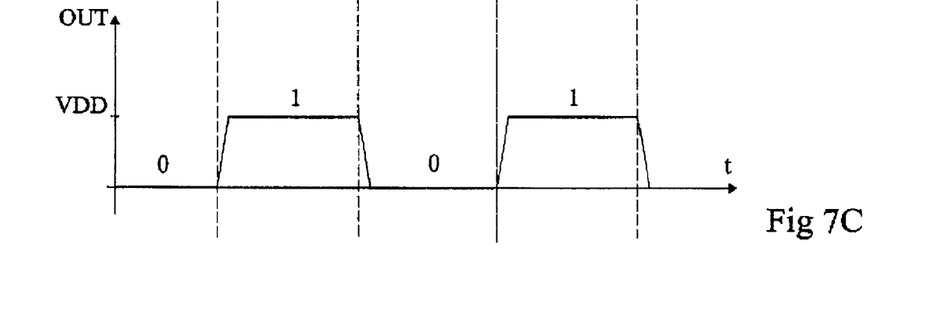

FIGS. 7A, 7B, and 7C are timing diagrams illustrating the operation of the demodulator of FIG. 6. FIG. 7A illustrates an example of a signal Vin to be demodulated. An amplitude modulation in all or nothing is assumed on a carrier of period T. FIG. 7B illustrates the shape of signal Vs(DC). It can be seen that in the presence of a sinusoidal train on input IN, signal Vs(DC) falls from its quiescent level V0 set by the biasing of generator 2, to a lower level. Amplitude Aout of the decrease depends on the bias level (quiescent point on the characteristic of FIG. 5) and on dynamic impedance 3. FIG. 7C illustrates the shape of signal OUT provided by comparator 7 which represents the transmitted data signal. In the shown example, a state 1 represented by a level Vdd and a state 0 represented by a level zero at the comparator output are assumed (neglecting the voltage drops in the comparator output stage). The inverse is of course possible. Threshold TH of comparator 7 is here selected to range between level V0 and level V0-Aout.

Figure 8:
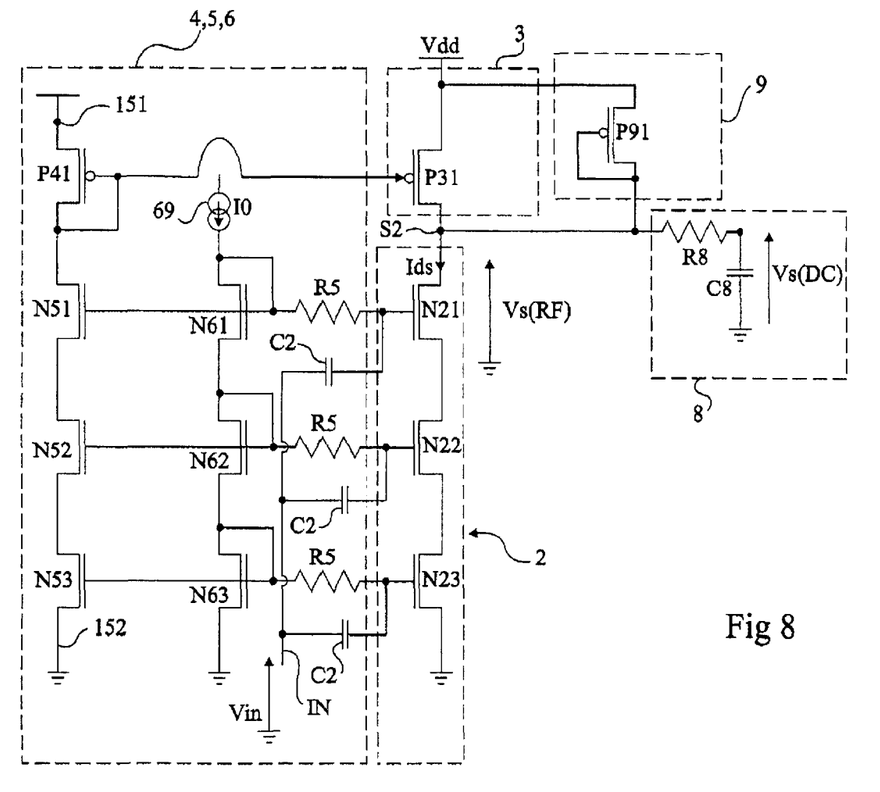
FIG. 8 is a detailed electric diagram of an embodiment of a detection circuit in accordance with the diagram of FIG. 6.

FIG. 8 is a detailed electric diagram of an embodiment of a demodulator using the functions illustrated in FIG. 6.

Distortion generator 2 comprises 3 N-channel MOS transistors in series N21, N22, and N23, having their respective gates coupled to terminal IN by decoupling capacitances C2. A P-channel MOS transistor P41 forms impedance 4. Transistor P41 is diode-assembled (its gate and drain are connected) between terminal 151 and a series association of three N-channel transistors N51, N52, and N53 forming current source 5. The gates of transistors N51 to N53 are connected to the respective gates of transistors N21 to N23 via resistors R5. Resistors R5 have strong values (at least several hundreds of kiloohms). Resistors R5 may in practice be formed of MOS transistors. As a variation, resistors R5 are replaced with inductances having values selected to exhibit a high impedance for the carrier and modulating signal pulses.

Three N-channel MOS transistors in series, N61, N62, and N63 are diode-assembled between current source 69 and ground 152 and form circuit 6. Transistors N61 to N63 and respective transistors N51 to N53 form current mirrors (interconnected gates). The function of resistors R5 is to prevent the dynamic component from rising back up to the bias circuit. Each resistor R5 forms a low-pass filter with the gate-source capacitance of transistor N61 to N63 with which it is coupled. Each transistor N61 to N63 also forms a current mirror with the transistor N21 to N23 with which it is coupled (by a resistor R5).

Dynamic impedance 3 is preferably formed of a P-channel MOS transistor P31 coupled between terminal 151 and terminal S2 providing output Vs(RF). As a variation, a passive resistor may be provided. However, the significant required value (on the order of one megaohm) generates a greater bulk than a transistor. Further, the use of an active load makes the circuit insensitive to temperature variations and technological drifts.

In FIG. 8, the existence of a low-pass filter formed, for example, of a resistive element R8 in series with a capacitive element C8 between terminal S and ground 152 is assumed. The junction point of resistor R8 and element C8 provides a voltage Vs(DC). Resistive element 8 may be a MOS transistor.

Finally, a gain-limiting element 9 is formed of a diode-assembled (connected gate and drain) P-channel MOS transistor P91 in parallel on transistor P31. This results in the insertion of a resistor (the on-state drain-source resistor—RdsON of transistor P91) in parallel with the dynamic resistor formed by transistor P31. Transistor P91 turns on as soon as the voltage at node S2 becomes greater than its threshold Vt.

If it is alone in the gain-limiting circuit, transistor P91 is selected so that its gate width-to-length ratio (W/L) is smaller than that of transistor P41 so that diode P91 does not conduct for a voltage thereacross equal to Vdd-V0 (plus the amplitude of the amplitude modulation distortions).

Figure 10:
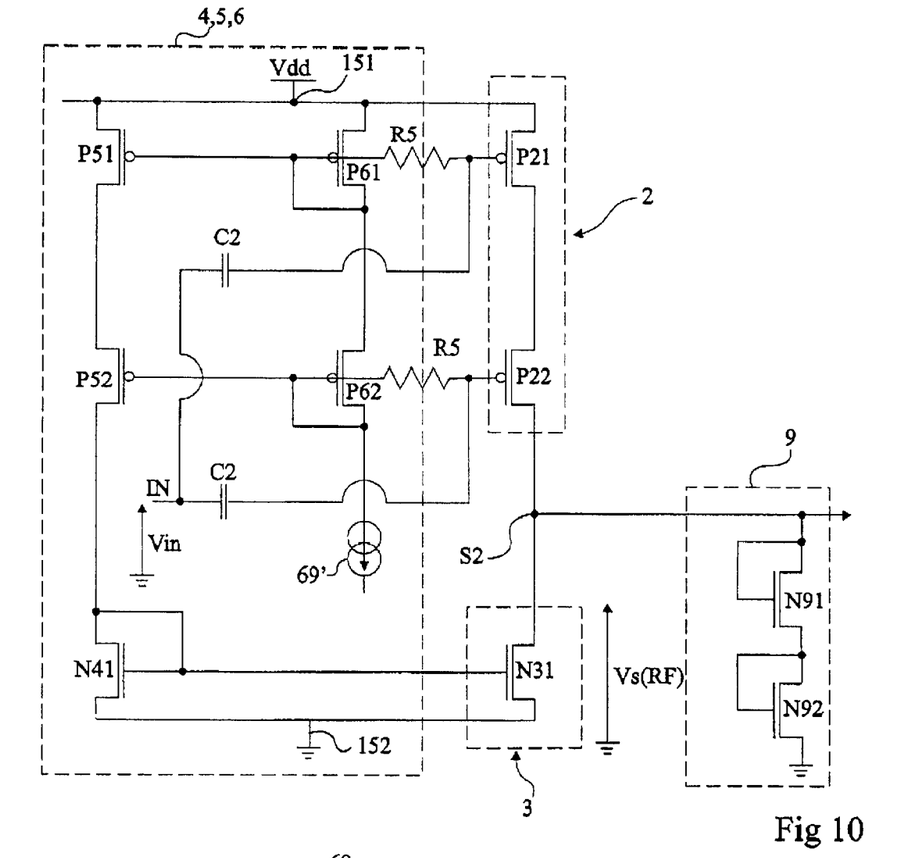
FIG. 10 is a detailed electric diagram of another embodiment of a detection circuit.
Figure 13:
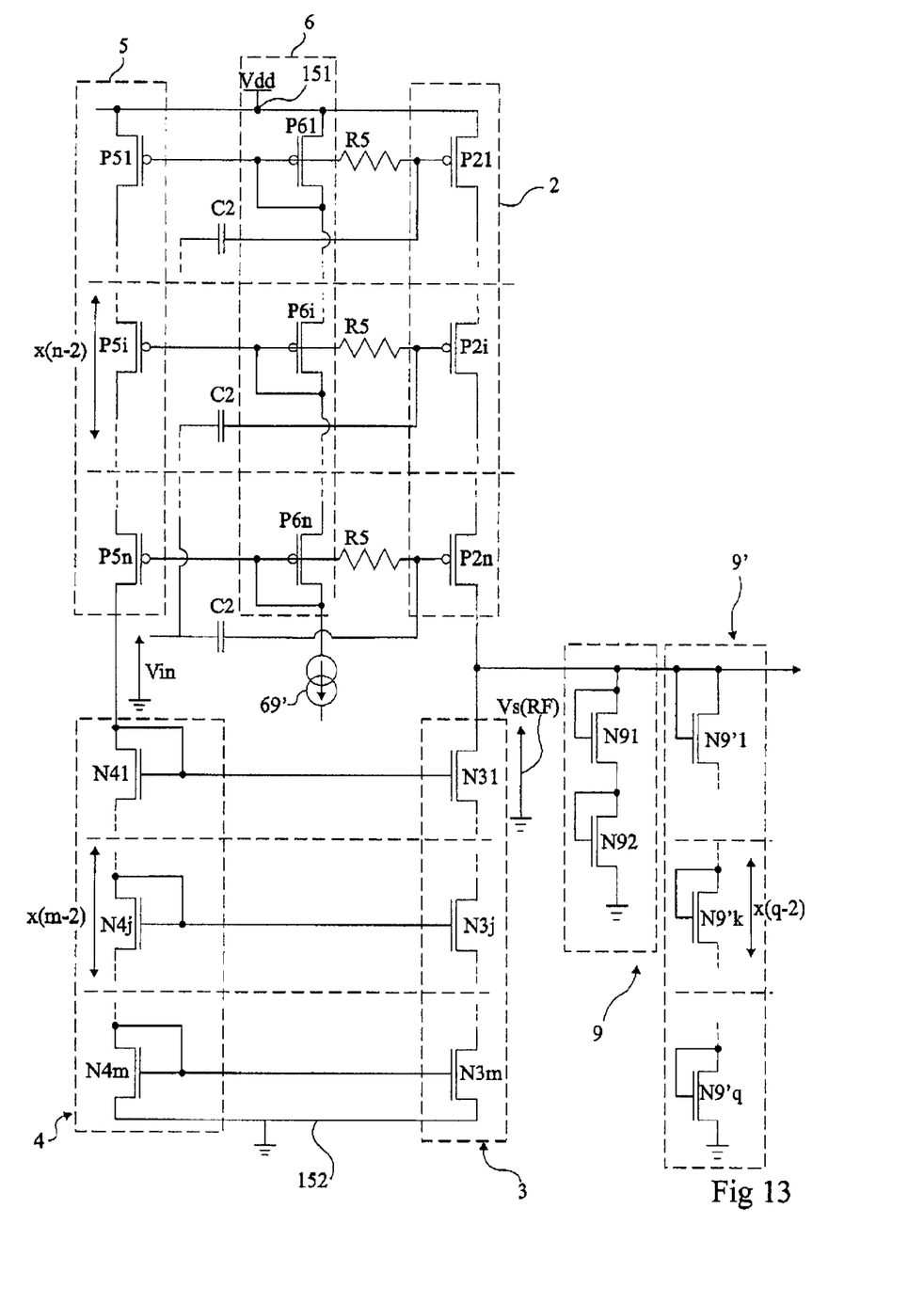
FIG. 13 shows an example of architecture of a detection circuit according to an embodiment.

Preferably, limiting element 9 comprises two diodes (two diode-assembled transistors) in series as will be seen hereafter in relation with FIGS. 10 and 13. This reduces the constraint on the gate width-to-length ratio.

The ratios of the surface areas of transistors P41 and P31 are preferably identical.

The comparator (7, FIG. 6) providing signal OUT has not been illustrated in FIG. 8 but may be present.

Figure 9A:
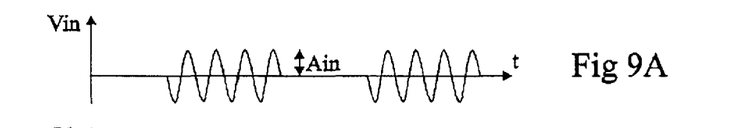
FIGS. 9A, 9B, 9C, and 9D are timing diagrams illustrating examples of shapes of signals of the circuit of FIG. 8.
Figure 9B:
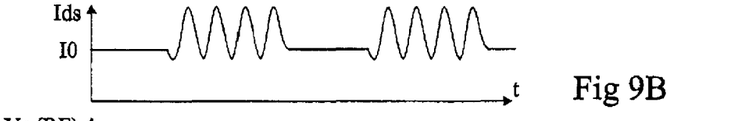
Figure 9C:
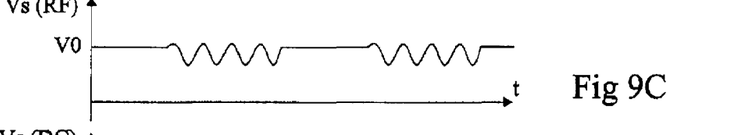
Figure 9D:
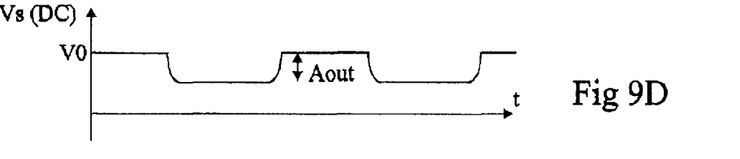

FIGS. 9A, 9B, 9C, and 9D are timing diagrams illustrating the operation of the detector of FIG. 8. FIG. 9A is an example of a signal Vin with a modulation amplitude Ain. FIG. 9B illustrates the corresponding shape of current Ids in generator 2. Current Ids has a quiescent level I0 set by current source 69 and reproduces the oscillations of signal Vin. The distortion between positive and negative halfwaves of the modulation translates as positive halfwaves (with respect to level I0) of an amplitude greater than that of negative halfwaves (with respect to level I0). FIG. 9C illustrates the shape of voltage Vs(RF) at node S2. The positive halfwaves of current Ids translate as attenuations of quiescent level V0 of voltage Vs. Finally, FIG. 9D illustrates the shape of voltage Vs(DC) at the output of low-pass filter 8. Each sinusoidal train of voltage Vs(RF) translates as a stage of a level lower than quiescent level V0. Amplitude Aout of the envelope signal (or of its inverse) recovered in FIG. 9D depends on the sizing of the different components.

An advantage is that conversion gain Aout/Ain of the demodulator is greater for lower modulation amplitudes, while consuming little.

Voltage V0 depends on current I0, on voltage Vdd, and on the size of transistor P31. The respective bias levels of the transistors are adapted so that in the quiescent state (in the absence of any signal on input IN), their respective voltages Vgs are lower than their voltages Vt. This adaptation is obtained by selecting the value of current source I0 and the sizes of the transistors of circuit 6 which have their on-states resistances conditioning the respective gate voltages of the transistors of generator 2. For example, this selection is performed according to the minimum supply voltage Vdd that the transistor can receive so that, at this minimum voltage, the transistors of generator 2 are all biased below their respective thresholds Vt.

The present inventors have made a detector such as illustrated in FIG. 8 and have obtained a conversion gain on the order of from 15 to 20 dB for modulation amplitudes of some ten millivolts and for a consumed power lower than 1 μW.

FIG. 10 shows another embodiment based on a distortion generator 2 made of P-channel MOS transistors.

Generator 2 comprises two P-channel MOS transistors P21 and P22, in series between terminal 151 and terminal S2, terminal S2 being coupled to terminal 152 via dynamic impedance 3 (here, an N-channel MOS transistor N31). The bias circuit (circuits 4, 5, and 6) comprises a current source 5 formed of two P-channel MOS transistors P51 and P52 in series between terminal 151 and an N-channel MOS transistor N41 connected to terminal 152 and constitutive of impedance 4. Transistor N41 is connected as a diode and forms a current mirror with transistor N31. Two P-channel MOS transistors P61 and P62 form current mirrors with transistors P51 and P52 and are diode-assembled between terminal 151 and a current source 69'. The gates of transistors P51 and P61 are interconnected and connected by a resistor R5 to the gate of transistor P21. The gates of transistors P52 and P62 are interconnected and connected by a resistor R5 to the gate of transistor P22. Signal Vin to be demodulated is, as in the previously-described assemblies, applied onto the respective gates of transistors P21 and P22 via decoupling capacitors C2. In the example of FIG. 10, a gain-limiting element 9 comprises two N-channel MOS transistors N91 and N92, in series between terminals S2 and 152. Optional low-pass filter 8 and comparator 7 have not been shown.

The operation of the P-channel transistor-based assembly for distortion generator 2 can be deduced from that of the N-channel transistor assembly. A difference is that the modulation trains translate as a level increase with respect to quiescent level V0.

Figure 11:
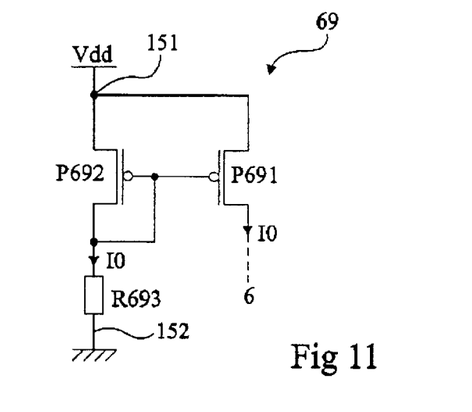
FIGS. 11 and 12 are partial diagrams illustrating embodiments of a detail of the respective circuits of FIGS. 8 and 10.
Figure 12:
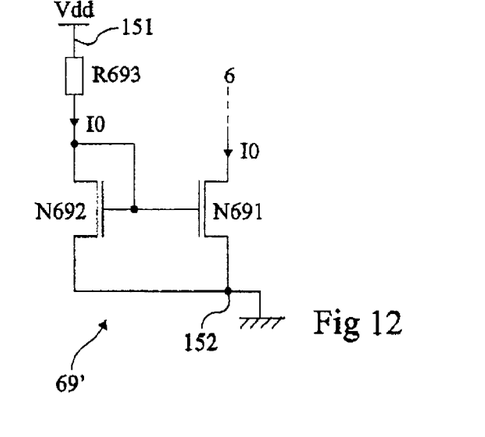

FIGS. 11 and 12 are partial electric diagrams illustrating embodiments of respective current sources 69 and 69' of the assemblies of FIGS. 8 and 10.

A current source 69 (FIG. 11) comprises a P-channel MOS transistor P691 coupled between terminal 151 and transistor N61 (FIG. 8). A diode-connected transistor P692 is in series with a resistive element R693 between terminals 151 and 152. Transistors P691 and P692 form a current mirror. Current I0 set by branch P692-R693 is copied in the branch of transistor P691 which provides it to circuit 6.

Current source 69' (FIG. 12) comprises an N-channel MOS transistor N691, coupled between transistor P62 and terminal 152 (FIG. 10). A resistive element R693 is in series with a diode-connected transistor N692, between terminals 151 and 152. Transistors N691 and N692 form a current mirror. Current I0 set by branch P692-R693 is copied in the branch of transistor P691 which samples it from circuit 6.

In the examples of FIGS. 11 and 12, the transistors are assumed to have identical sizes, but different sizes may set a non-unity ratio between the two branches of the current sources. Further, the representations are only examples of simple current sources, but any usual current source scheme may be used (for example, with other branches, with a temperature-stable assembly, insensitive to power supply variations, etc.).

FIG. 13 is an electric diagram generalizing the architecture of the demodulator of FIG. 10 to a number n of transistors in series in distortion generator 2 and to a number m of transistors in series in impedance 4. The P-channel transistors of circuits 2, 5, 6, have been designated as P5$i$, P6$i$, and P2$i$, with $i$ designating the index ranging between 1 and n of the transistor in the series association. The N-channel transistors of circuits 3 and 4 have been designated as N3$j$ and N4$j$, with $j$ designating the index ranging between 1 and m of the transistor in the series association.

FIG. 13 further illustrates a variation according to which two current-limiting elements are provided. A first limiting element 9 is identical to that described in relation with FIG. 10. A second limiting element 9' comprises q (with q greater than 2) N-channel MOS transistors N9'1, N9'$k$ (ranging in the drawing between 2 and q–1) and N9'$q$. The function of element 9' is to intervene in case of a relatively high supply voltage with respect to that for which the diodes of element 9 trigger.

A similar generalization architecture may be shown, based on the diagram of FIG. 8, for a distortion generator 2 based on N-channel MOS transistors.

Numbers n, m, and q of transistors to be used in the assembly depend on the application and, in particular, on the expected supply voltages on operation of the assembly.

Another advantage is that the input signal at relatively high frequency is converted into a signal of lower frequency (average value), which enables decreasing the power consumption of downstream circuits.

Another advantage of an embodiment is that the detector is insensitive to operating temperature variations and to technological dispersions.

Another advantage of an embodiment is the adaptiveness of the demodulator to the available supply voltage.

Another advantage is that the circuit is adapted to being formed in a standard CMOS technology.

Specific embodiments of the present invention have been described. Different variations and modifications will occur to those skilled in the art. In particular, although the present invention has been discussed in relation with a signal modulated in all or nothing, it applies whatever the amplitude modulation type. For example, for an amplitude modulation having a different modulation rate, threshold TH of comparator 7 may be adapted to distinguish the two levels.

Further, the selection of the number of transistors in series in the different elements depends on the application and, in particular, on the expected supply voltage and on its possible variations. The higher the voltage, the greater the number of transistors in series may be. The greater the expected variations, the greater the number of limiting elements in parallel with different thresholds which will be provided.

Moreover, the circuit may be used in simplified fashion to detect the presence of a field sensed by the transponder, for example, by suppressing any limiting element and by selecting threshold TH below level 0 of the modulation.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A detector of a radio-frequency signal, comprising:
   at least one first MOS transistor with a channel of a first type, having a gate of the at least one first MOS transistor coupled to an input terminal capable of receiving said radio-frequency signal;
   a circuit for providing a filtered output signal representative of a drain-to-source current in the at least one first MOS transistor,
   a first current source; and
   an auto-bias circuit comprising at least one second MOS transistor with a channel of the first type, the at least one second MOS transistor configured as a diode and forming at least one current mirror with the at least one first MOS transistor, the auto-bias circuit configured to bias the at least one first MOS transistor to a level lower than a threshold voltage of the at least one first MOS transistor, the auto-bias circuit further comprising:
a first impedance comprising at least one third MOS transistor with a channel of a second type, the at least one third MOS transistor configured as a diode; and
a second current source in series with the first impedance, second current source comprising at least one fourth MOS transistor with a channel of the first type, a total number of fourth transistors being identical to a total number of first transistors, the at least one fourth MOS transistor forming at least one current mirror with the at least one second MOS transistor.

2. The detector of claim 1, wherein the auto-bias circuit further comprises:
an active load comprising at least one fifth transistor with a channel of a second type, the active load connected in series with the at least one first MOS transistor and forming a current mirror with the at least one third MOS transistor.

3. The detector of claim 1, wherein respective gates of the at least one fourth and at least one second transistors are coupled, by at least one resistive element to respective gates of the at least one first transistor.

4. The detector of claim 2, wherein the at least one fifth transistor comprises a plurality of series-connected transistors.

5. The detector of claim 4, wherein a total number of fifth transistors is identical to a total number of third transistors.

6. The detector of claim 2, further comprising at least one gain limiter coupled in parallel with the active load.

7. The detector of claim 1, wherein respective gates of the at least one first transistors are coupled via at least one capacitive decoupling element to an input terminal configured to receive said radio-frequency signal.

8. The detector of claim 1, wherein the circuit for providing the filtered output signal is configured to provide averaging of the signal passing therethrough.

9. The detector of claim 1, wherein the first channel type is N and the second channel type is P.

10. The detector of claim 1, wherein the first channel type is P and the second channel type is N.

11. The detector of claim 1, further comprising
a comparator configured to compare the output signal to a threshold value and provide a first output value or a second output value based on the comparison.

12. A system for detecting a radio-frequency signal comprising:
the detector of claim 1;
an antenna configured to receive the radio-frequency signal and provide the radio-frequency signal to the detector; and
a unit for processing the output signal provided by the detector.

13. The system of claim 12, disposed within an electromagnetic transponder.

14. An RFID tag comprising the detector of claim 1.

15. The detector of claim 1, wherein the at least one first MOS transistor comprises a plurality of series-connected MOS transistors.

16. The detector of claim 1, wherein the at least one second MOS transistor comprises a plurality of series-connected MOS transistors identical in number to the at least one first MOS transistor.

17. An amplitude demodulation method, comprising:
applying a signal to be demodulated onto the gate of at least one first MOS transistor, biased to a level lower than a threshold voltage of the at least one first MOS transistor;
processing a signal representative of a drain-to-source current in the at least one first MOS transistor to determine an envelope of the signal;
auto-biasing the at least one first MOS transistor with a first auto-bias circuit, the first auto-bias circuit comprising at least one second MOS transistor configured in at least one current mirror connection with the at least one first MOS transistor; and
auto-biasing an active load of the at least one first MOS transistor with a second auto-bias circuit, the second auto-bias circuit comprising at least one third MOS transistor configured in at least one current mirror connection with the at least one second MOS transistor.

18. The method of claim 17, wherein the processing comprises filtering the signal representative of the drain-to-source current with a low pass filter.

19. The method of claim 17, wherein the processing comprises comparing the signal representative of the drain-to-source current to a threshold.

20. The method of claim 17, further comprising receiving the signal to be demodulated with an antenna of an RFID tag.

21. The method of claim 17, further comprising providing the signal representative of the drain-to-source current to a microprocessor of an RFID tag.

22. The method of claim 17, further comprising setting a bias level of the second auto-bias circuit with the first auto-bias circuit.

* * * * *